(12) United States Patent
Kokubu et al.

(10) Patent No.: US 8,698,187 B2
(45) Date of Patent: Apr. 15, 2014

(54) LIGHT EMITTING DEVICE

(75) Inventors: Hideki Kokubu, Kiyosu (JP); Kosei Fukui, Kiyosu (JP); Toshimasa Hayashi, Kiyosu (JP)

(73) Assignee: Toyoda Gosei Co., Ltd., Kiyosu-Shi, Aichi-Ken (JP)

( * ) Notice: Subject to any disclaimer, the term of this patent is extended or adjusted under 35 U.S.C. 154(b) by 0 days.

(21) Appl. No.: 13/200,647

(22) Filed: Sep. 28, 2011

(65) Prior Publication Data
US 2012/0080711 A1  Apr. 5, 2012

(30) Foreign Application Priority Data

Sep. 30, 2010 (JP) .................................. 2010-220466

(51) Int. Cl.
*H01L 33/62* (2010.01)

(52) U.S. Cl.
USPC ............. 257/99; 257/673; 257/666; 257/737; 257/738; 257/9; 257/E21.511; 257/E23.021; 257/E23.046; 257/E21.499; 257/E33.056; 438/27

(58) Field of Classification Search
USPC ........ 257/99, 98, 666, E33.066, 737; 362/27; 372/43.01; 438/27
IPC ....................................................... H01L 33/62
See application file for complete search history.

(56) References Cited

U.S. PATENT DOCUMENTS

| 5,748,658 | A  | * | 5/1998 | Nakanishi et al. ......... 372/43.01 |
| 7,422,338 | B2 |   | 9/2008 | Kono et al. |
| 2007/0075306 | A1 | * | 4/2007 | Hayashi et al. ................ 257/13 |
| 2007/0120234 | A1 | * | 5/2007 | Kim et al. ..................... 257/666 |
| 2008/0012033 | A1 | * | 1/2008 | Arndt ............................... 257/98 |
| 2009/0224271 | A1 | * | 9/2009 | Seo et al. ......................... 257/98 |
| 2011/0175127 | A1 |   | 7/2011 | Kanada et al. |

FOREIGN PATENT DOCUMENTS

| JP | 2006-86178 A | 3/2006 |
| JP | 2007-311736 A | 11/2007 |
| JP | 2007-311736 A | 11/2007 |
| JP | 2009-9956 A | 1/2009 |
| JP | 4239509 B2 | 3/2009 |
| JP | 2010-34295 A | 2/2010 |
| JP | 2010-34325 A | 2/2010 |
| WO | WO 2007/142018 A1 | 12/2007 |
| WO | WO 2010/013396 A1 | 2/2010 |

OTHER PUBLICATIONS

Notification of Reasons for Refusal dated Mar. 6, 2013 in corresponding Japanese Patent Application No. 2010-220466.

* cited by examiner

*Primary Examiner* — Jerome Jackson, Jr.
*Assistant Examiner* — Bo Fan
(74) *Attorney, Agent, or Firm* — McGinn IP Law Group, PLLC (57) ABSTRACT

A light emitting device comprises a case having a space therein, the space defined by an inner bottom surface and an inner side surface of the case, a lead frame housed in the space, and having a bending portion bent along the inner side surface of the case, and a light emitting element electrically connected to the lead frame, wherein a rear surface of the bending portion is embedded in the case and a front surface of the bending portion is exposed from the inner side surface of the case so as to oppose the light emitting element, and wherein a projecting portion projected from the inner bottom surface and inclined to the inner side surface of the case is formed on the inner side surface of the case.

19 Claims, 6 Drawing Sheets

LIGHT EMITTING DEVICE

BACKGROUND OF THE INVENTION

1. Field of the Invention

The present invention relates to a thin light emitting device.

2. Description of the Related Art

A side-view light emitting device (a side-view light emitting device) is available as a thin light emitting device used for a backlight, or the like, of a liquid crystal display as described in connection with Patent Documents 1 through 3.

In an invention described in connection with Patent Document 1, a plurality of light emitting elements are put on different lead frames (lead electrodes), and heat radiation performance is enhanced by means of conducting heat, developed from the respective light emitting elements, through different heat radiation channels to the outside.

An invention described in connection with Patent Document 2 is directed toward a package making up an opening for extracting light from a light emitting element. Walls of the package that oppose each other in a lateral direction include a first wall opposing the light emitting element, a second wall having a step with respect to the first wall, and a third wall connecting the first wall to the second wall. The second wall and the third wall are made thicker than the first wall, thereby enhancing mechanical strength of the package.

In the invention described in connection with Patent Document 2, the first wall, the second wall, and the third wall each have different taper angles, thereby enhancing light extraction efficiency.

An invention described in connection with Patent Document 3 is directed toward a package in which an exposed lead frame on a inner bottom surface of the package is bent toward a side surface of the package, to thus form a reflecting portion. A portion of an inner wall surface of the reflecting portion is situated in the package. Thereby, the reflecting portion reflects light from the light emitting element so as to prevent discoloration of the package. Adhesion between the reflecting portion and the package is also enhanced, to thus prevent exfoliation of the reflecting portion from the package.

Patent Document 1: Japanese Patent No. 4239509
Patent Document 2: JP-A-2007-311736
Patent Document 3: JP-A-2010-34325

In the invention described in connection with Patent Document 3, the reflecting portion of the lead frame is embedded in the package. Accordingly, an area not filled with a synthetic resin (i.e., short shot) is likely to occur in the opening side of the package that is also an extremity side of the reflecting portion, which deteriorates the mold-ability of the package.

Accuracy achieved during machining a bend of the reflecting portion of the lead frame is lower than accuracy achieved during injection molding of the package. Therefore, there is apprehension that the reflecting portion may come off from the package because of heat applied during injection molding of the package or use of the light emitting device.

SUMMARY OF THE INVENTION

The present invention has been conceived to solve the drawbacks and aims at preventing the lead frame coming off from the package as well as providing a light emitting device that exhibits enhanced moldability by preventing occurrence of an unfilled area, which would otherwise arise during injection molding of a synthetic resin for forming a package.

As a result of the present inventors having conducted assiduous studies to solve the drawbacks, they have conceived respective aspects of the present invention as will be described below.

A first aspect of the invention provide with a light emitting device, comprising a case having a space therein, the space defined by an inner bottom surface and an inner side surface of the case, a lead frame housed in the space, and having a bending portion bent along the inner side surface of the case, and a light emitting element electrically connected to the lead frame, wherein a rear surface of the bending portion is embedded in the case and a front surface of the bending portion is exposed from the inner side surface of the case so as to oppose the light emitting element; and wherein a projecting portion projected from the inner bottom surface and inclined to the inner side surface of the case is formed on the inner side surface of the case.

The projecting portion of the case acts as a reinforcing member, and mechanical strength of the case is eventually enhanced. Therefore, even when the case is miniaturized, chipping or curling of the case can be prevented. Deformation of the case, which would otherwise be caused by thermal expansion occurring during use of the light emitting device, can also be prevented.

The inner side surfaces of the case act as a reflector that reflects light from the light emitting element, so as to let the light exit from the opening portion.

A surface of the bending portion of the lead frames is exposed from the inner side surfaces of the case act as a reflector in the same way as the inner side surface.

Consequently, an area on the inner side surface of the case that is situated at the back of the bending portion of the lead frame is not exposed to light from the light emitting element. Consequently, a synthetic resin that is a material making up that area can be avoided to undergo discoloration, deformation, and deterioration.

A second aspect of the invention provide with the light emitting device in which an angular portion of the lead frame in which the bending portion is bent is rounded.

As a result of the projecting portion being provided in the case, flow channels for synthetic resin toward the opening portion of the case that is on the extremity side of the bending portion of the lead frame are assured. Therefore, there can be prevented occurrence of an area not filled with a synthetic resin in the area of the case in proximity to the opening portion, so that moldability of the case can be enhanced.

As a result of the projecting portion being provided in the case, the bending portion of the lead frame is pressed by the projecting portion. Therefore, the bending portion can reliably be prevented from coming off from the inner side surface of the case.

The projecting portion of the case assumes a tapered shape and therefore acts as a reflector, so that light extraction efficiency of the light emitting device can be enhanced.

A third aspect of the invention provide with the light emitting device, wherein pointed angular portions of the bending portion of the lead frame is rounded.

Therefore, the flow channels of the synthetic resin to the back side of the angular portions of the lead frame are sufficiently broadened and ensured. For this reason, occurrence of an area not filled with a synthetic resin on the back side of the angular portions can be prevented, so that the moldability of the case can be enhanced.

Therefore, the flow channels of the synthetic resin to both of the pointed angular portions of the lead frame is sufficiently broadened and ensured. Consequently, there can be prevented occurrence of an area not filled with a synthetic resin in the vicinity of both of the pointed angular portions, so that the moldability of the case can be enhanced.

The pointed angular portions of the lead frame can be prevented from coming off from the inner side surfaces of the case.

A fourth aspect of the invention provide with the light emitting device, wherein a notch is formed in an area of the lead frame in proximity to an end of the bending portion.

For this reason, stress that stems from bending action during formation of the bending portion is released by the notch, and the thus-bent angular portion can be situated opposite the bending portions.

Therefore, the accuracy achieved during machining of the bending portions is enhanced, so that the bending portions can be reliably prevented from coming off from the case.

Moreover, the flow channels of the synthetic resin to the back side of the bent angular portions are sufficiently broadened and ensured. For this reason, occurrence of an area not filled with a synthetic resin on the back side of the angular portions can be prevented, so that the moldability of the case can be enhanced.

In order to efficiently distribute and release the stress exerted on the notches, it is desirable to give a substantially-U-shaped profile to the notches.

A fifth aspect of the invention provide with the light emitting device, wherein the projecting portion entirely cover a lateral side portion of the bending portion; and wherein the projecting portion is formed so as to become higher than the bending portion and become equal to or lower than the inner side surface of the case. Consequently, the operation and advantages yielded in the first aspect can be further enhanced.

A sixth aspect of the invention provide with the light emitting device, wherein the light emitting element is provided in numbers; wherein the respective light emitting elements are mounted on the respective different lead frames; and wherein the columnar portions are formed between the bending portions of the adjacent lead frames, so as to cover lateral ends of the adjacent bending portions.

Accordingly, heat developed from the respective light emitting elements travels through different heat radiation channels by way of respective other lead frames, to thus exit outside. Hence, even when a heavy electric current is caused to flow in order to illuminate the light emitting elements at high intensity, heat will not build up. Thus, a heat dissipation characteristic can be enhanced.

The columnar portions can be efficiently arranged in the case, so that space in the case can be efficiently utilized.

DESCRIPTION OF THE PREFERRED EMBODIMENTS

An embodiment materializing the present invention is hereunder described by reference to the drawings.

Figure 1:
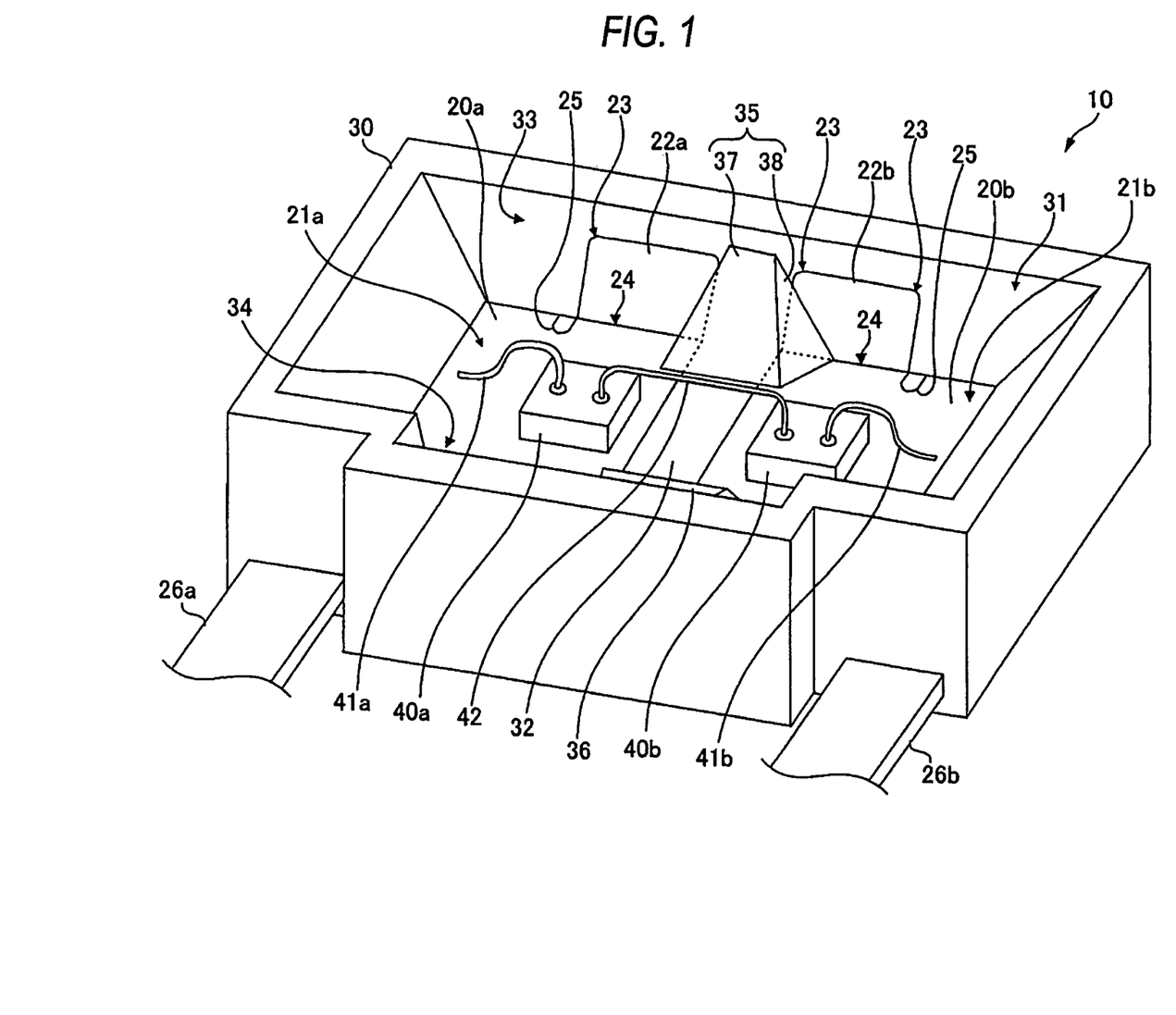
FIG. 1 is an oblique perspective view of a side-view-type light emitting device (a side-view light emitting device) 10, which is an embodiment materializing the present invention, when viewed sideways.

FIG. 1 is an oblique perspective view of a side-view-type light emitting device (a side-view light emitting device) 10, which is an embodiment, when viewed sideways.

Figure 2:
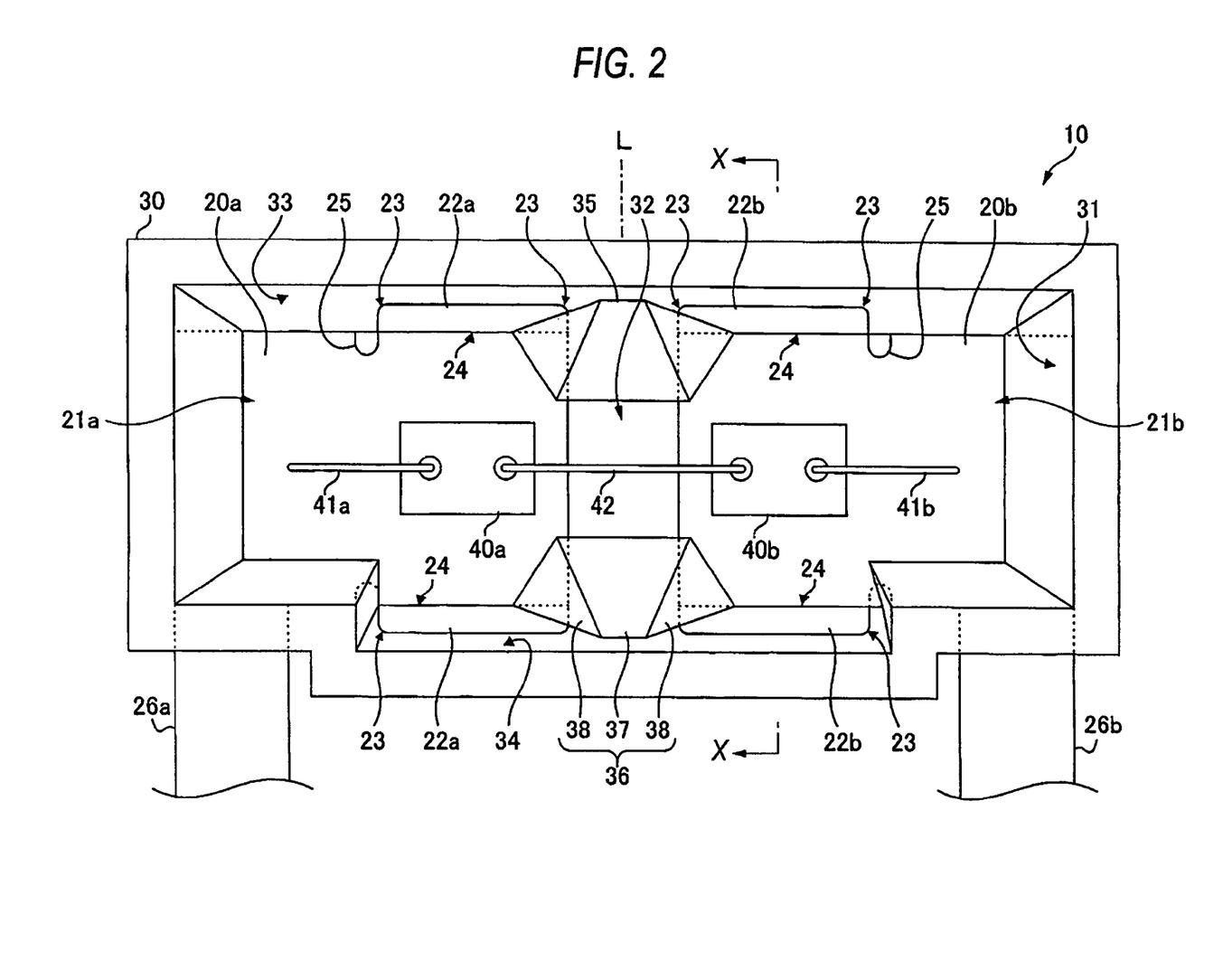
FIG. 2 is a plan view of the light emitting device 10 when viewed sideways.

FIG. 2 is a plan view of the light emitting device 10 when viewed sideways.

Figure 3:
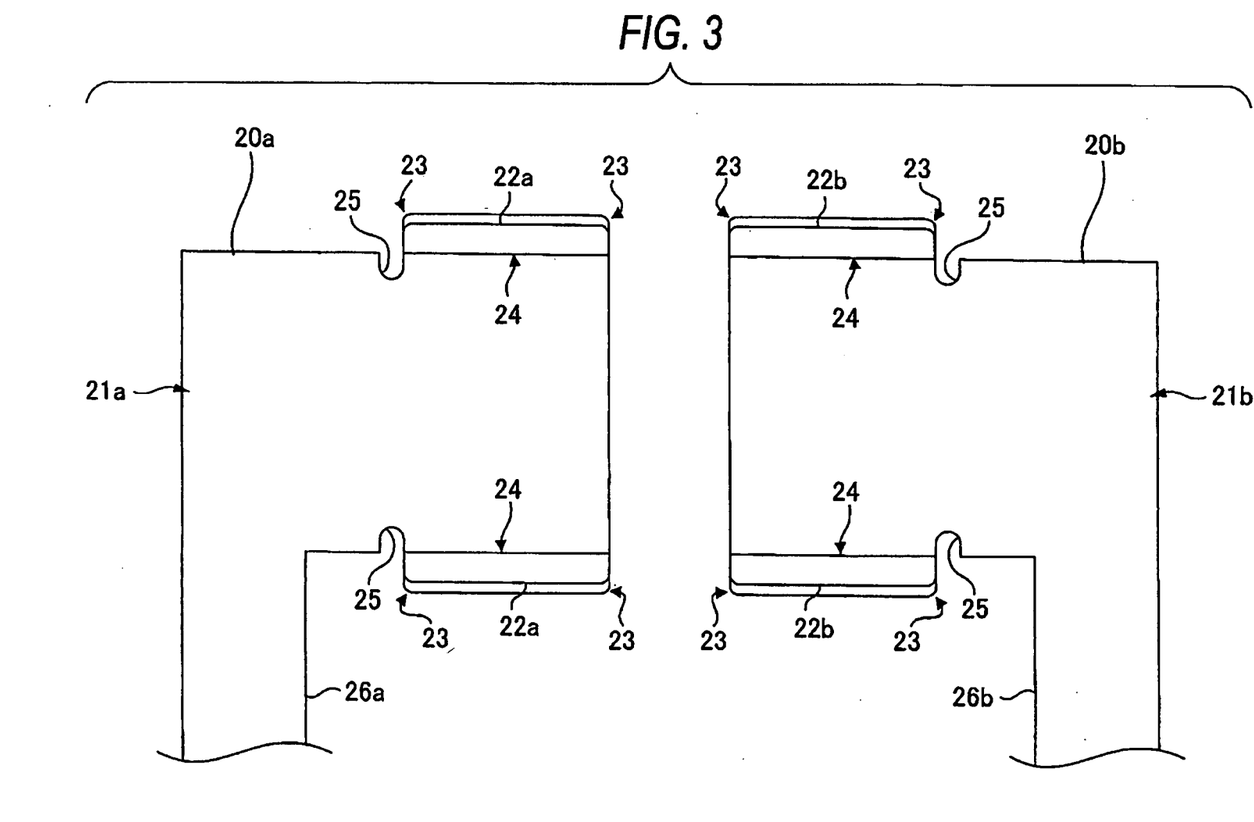
FIG. 3 is a plan view of lead frames 20a and 20b of the light emitting device 10.

FIG. 3 is a plan view of lead frames 20a and 20b of the light emitting device 10.

Figure 4:
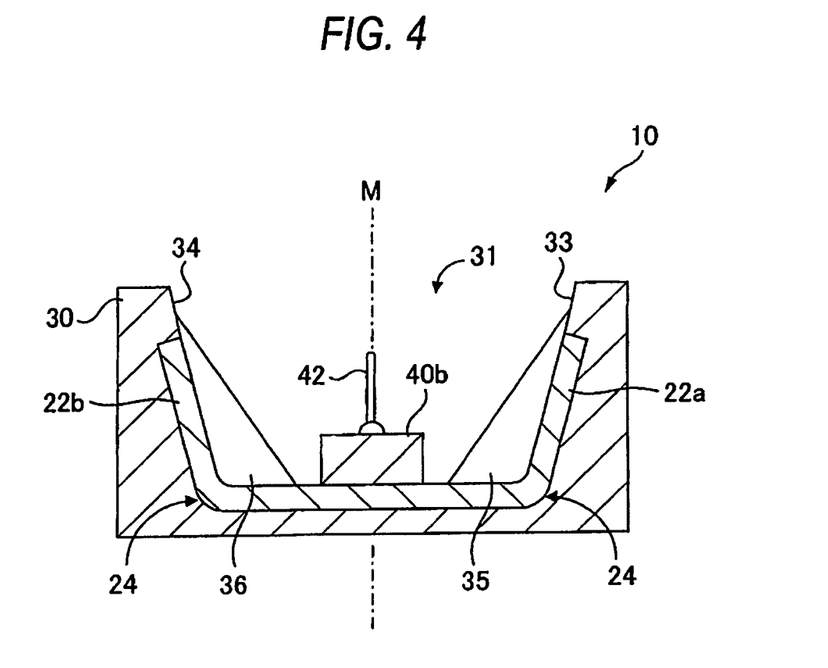
FIG. 4 is a longitudinal cross sectional view of the light emitting device 10; namely, a cross sectional view acquired when viewed in a direction of arrow X-X shown in FIG. 2.

FIG. 4 is a longitudinal cross sectional view of the light emitting device 10; namely, a cross sectional view acquired when viewed in a direction of arrow X-X shown in FIG. 2.

The light emitting device 10 is made up of the lead frames 20a and 20b, a case (a package) 30, light emitting element chips 40a and 40b, bonding wires 41a and 41b, and 42, and so on.

The light emitting device 10 assumes a box shape of a horizontally long, substantially rectangular parallelepiped; namely, a shape symmetrical about a center line L that divides a longitudinal direction of the light emitting device into two equal halves (see FIG. 2).

For this reason, like constituent members of the light emitting device 10 provided in one of the equal halves symmetrical about the center line L are distinguished from their counterpart constituent members by adding a suffix "a" or "b" to like reference numerals.

The case 30, which is made of a synthetic resin by means of injection molding, houses the lead frames 20a, 20b and the light emitting element chips 40a, 40b.

The lead frames 20a and 20b are formed by means of pressing a metal plate.

An inner side surface of the case 30 is formed into an opening portion 31 whose entire is opened so that the case has an opened space therein. Upper surfaces 21a and 21b of the respective lead frames 20a and 20b stay open (exposed) from an inner bottom surface 32 of the case 30. The opened space is defined by the inner side surface of the case 30 and the inner bottom surface 32 of the case 30.

The light emitting element chips 40a and 40b assuming a shape of a flattened, substantially rectangular parallelepiped are fixedly put on the respective upper surfaces 21a and 21b of the lead frames 20a and 20b, to thus be mounted.

The light emitting element chips 40a and 40b are made up of an optical semiconductor light emitting element chip; for instance, an LED lamp element and an organic EL lamp element.

A positive electrode (omitted from the drawings) and a negative electrode (omitted from the drawings) are formed on an upper surface of each of the light emitting element chips 40a and 40b.

By use of a wire bonding technique, the positive electrode of the light emitting element chip 40a and the upper surface 21a of the lead frame 20a are electrically connected together by means of the bonding wire 41a. Further, the negative electrode of the light emitting element chip 40b and the upper surface 21b of the lead frame 20b are electrically connected together by means of the bonding wire 41b. The negative electrode of the light emitting element chip 40a and the positive electrode of the light emitting element chip 40b are electrically connected together by means of bonding wires 42.

Inner side surfaces of the case 30 are inclined toward the opening portion 31. Inner side surfaces 33 and 34, opposing each other in a lateral direction of the case 30, are symmetrical in shape about a center line M (see FIG. 4) that divides the lateral direction of the case into two equal halves and are at the same angle of inclination with respect to the center line.

The lead frames 20a and 20b have bending portions 22a and 22b bent along the respective mutually-opposed inner side surfaces 33 and 34 of the case 30. Front surfaces of the bending portions 22a and 22b stay open at the inner side surfaces 33 and 34 of the case 30, to thus oppose the respective light emitting element chips 40a and 40b. Rear surfaces and end surfaces of the respective bending portions 22a and 22b are embedded (buried) in the case 30.

In the respective lead frames 20a and 20b, both pointed angular portions 23 of the respective bending portions 22a and 22b are rounded. Further, angular portions (curvatures) 24 by means of which the bending portions 22a and 22b are bent are also rounded.

Substantially U-shaped notches 25 are formed at positions on the upper surface 21a of the lead frame 20a in proximity to ends of the respective bending portions 22a. Likewise, substantially U-shaped notches 25 are also formed at positions on the upper surface 21b of the lead frame 20b in proximity to ends of the respective bending portions 22b.

A columnar portion (a projecting portion or a rib) 35 is formed between the bending portions 22a and 22b of the lead frames 20a and 20b on the inner side surface 33 of the case 30. The columnar portion 35 covers the entirety of mutually-opposed lateral ends of the bending portions 22a and 22b; the columnar portion 35 is wholly inclined to the inner side surface 33 of the case 30 toward the opening portion 31; and assumes a wedged longitudinal cross-sectional profile. Likewise, a columnar portion (a projecting portion or a rib) 36 analogous to the columnar portion 35 is also formed between the bending portions 22a and 22b of the lead frames 20a and 20b on the inner side surface 34. The columnar portions 35 and 36 are positioned so as to oppose each other along the lateral direction of the case 30. A width of the longitudinal cross sectional profile of each of the columnar portions 35 and 36 becomes smaller toward the opening portion 31. Also, the columnar portions 35 and 36 are monothethically formed with the case by a synthetic resin.

The columnar portions 35 and 36 are formed so as to become higher than the respective bending portions 22a and 22b but become equal to or lower than the respective inner side surfaces 33 and 34 of the case 30. Thus, extremities of the respective columnar portions 35 and 36 are avoided to project to the outside of the case 30 by way of the opening portion 31.

Mutually-opposed front portions 37 of the columnar portions 35 and 36 make up trapezoidal slopes, and each of lateral side portions 38 of the respective columnar portions 35 and 36 makes up a triangular slope. Therefore, the columnar portions 35 and 36 each are tapered toward the opening portion 31.

In each of the columnar portions 35 and 36, the lateral side portions 38 and the front portion 37 are connected so as to form obtuse angles.

A substantially rectangular lengthy extended portion 26a is formed on the lead frame 20a, and a similar extended portion 26b is formed on the lead frame 20b. Respective anchored ends of the extended portions 26a and 26b are embedded in the case 30, whilst respective free ends of the extended portions 26a and 26b extend outside the case 30, thereby making up connection terminals of the light emitting device 10.

(Operation and Advantages of the Embodiment)

The light emitting device 10 of the present embodiment can exhibit operation and yield advantages, which will be described below.

[1] The lead frames 20a and 20b have the respective bending portions 22a and 22b bent along the mutually-opposed inner side surfaces 33 and 34 of the case 30. The rear surfaces and the end surfaces of the respective bending portions 22a and 22b are embedded in the case 30, whereas respective front surfaces of the bending portions 22a and 22b stay open at the inner side surfaces 33 and 34 of the case 30, thereby opposing the respective light emitting element chips 40a and 40b. The columnar portion 35 that covers the lateral ends of the bending portions 22a and 22b and that is tapered toward the opening portion 31 of the case 30 is formed on the inner side surface 33 of the case 30, and the similar columnar portion 36 is formed on the inner side surface 34 of the case 30.

The case 30 acts as a support that fixedly holds the lead frame 20a on which the light emitting element chip 40a is mounted and also as a support that fixedly holds the lead frame 20b on which the light emitting element chip 40b is mounted. The case 30 also exhibits a function of protecting the light emitting element chips 40a and 40b from the external environment.

The columnar portions 35 and 36 of the case 30, act as the reinforcing member. Since the mechanical strength of the case 30 is enhanced, chipping or curling of the case 30, which would otherwise arise when the case 30 is miniaturized, can be prevented. Deformation of the case 30, which would otherwise be caused by thermal expansion occurring during use of the light emitting device 10, can also be prevented.

The inner side surfaces 33 and 34 of the case 30 are inclined toward the opening portion 31. The inner side surfaces of the case 30 act as a reflector for reflecting light from the respective light emitting element chips 40a and 40b, to thus let the light exit from the opening portion 31.

The surfaces of the respective bending portions 22a and 22b of the lead frames 20a and 20b staying open at the inner side surfaces 33 and 34 of the case 30 act as a reflector in the same way as the inner side surfaces 33 and 34. For this reason, the surfaces of the respective bending portions 22a and 22b of the lead frames 20a and 20b must exhibit a sufficient reflection characteristic. For instance, it is preferable to use a metal plate exhibiting a high reflection characteristic or apply highly reflective plating to the surfaces of the bending portions 22a and 22b.

Areas on the inner side surfaces 33 and 34 of the case 30 that are situated at the back of the bending portions 22a and 22b of the respective lead frames 20a and 20b are not exposed to light from the light emitting element chips 40a and 40b. Consequently, a synthetic resin that is a material making up that area can be avoided to undergo discoloration, deformation, and deterioration.

Incidentally, the bending portions 22a and 22b of the respective lead frames 20a and 20b are embedded in the inner side surfaces 33 and 34 of the case 30. Hence, an area not filled with a synthetic resin (i.e., short shot) is likely to occur in an area of the case in proximity to the opening portion 31 of the case 30 that is on the extremity sides of the bending portions 22a and 22b during synthetic resin injection molding for forming the case 30, which may deteriorate the moldability of the case 30.

Accordingly, as a result of the columnar portions 35 and 36 being provided in the case 30, there are assured flow channels for synthetic resin toward the opening portion 31 of the case 30 that is on the extremity sides of the bending portions 22a and 22b. Therefore, it is possible to prevent occurrence of an area not filled with a synthetic resin in the area of the case in proximity to the opening portion 31, so that moldability of the case 30 can be enhanced.

Accuracy achieved during machining the angular portions (the curvatures) 24 by means of which the bending portions 22a and 22b of the respective lead frames 20a and 20b are bent is lower than accuracy achieved during injection molding of the case 30. Therefore, there is apprehension that the bending portions 22a and 22b may come off from the inner side surfaces 33 and 34 of the case 30 because of the heat applied during injection molding of the case 30 or use of the light emitting device 10.

In order to enhance electrical conductivity and thermal conductivity of the lead frames 20a and 20b, the lead frames 20a and 20b must be made thick. If the lead frames 20a and 20b are made thick, the bending portions 22a and 22b will become likely to come off from the inner side surfaces 33 and 34 of the case 30.

Accordingly, as a result of the columnar portions 35 and 36 being provided in the case 30, the bending portions 22a and 22b of the lead frames 20a and 20b are pressed by the columnar portions 35 and 36. Therefore, the bending portions 22a and 22b can reliably be prevented from coming off from the inner side surfaces 33 and 34 of the case 30.

[2] In each of the columnar portions 35 and 36 of the case 30, both lateral side portions 38 that are trapezoidal slopes and the front portion 37 that is a triangular slope are connected so as to form obtuse angles, and the columnar portions 35 and 36 are tapered toward the opening portion 31.

Consequently, the columnar portions 35 and 36 of the case 30 act as a reflector in much the same way as the inner side surfaces 33 and 34 of the case 30, so that light extraction efficiency of the light emitting device 10 can be enhanced.

Figure 5A:
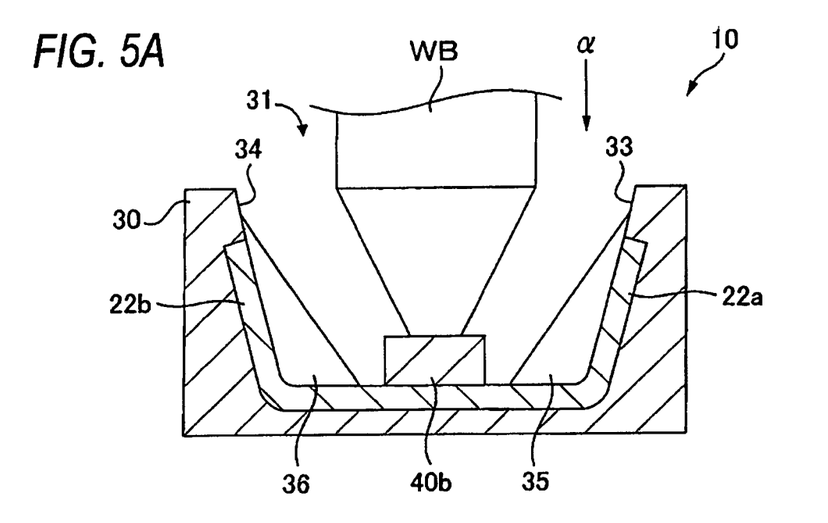
FIG. 5A is a diagrammatic illustration showing a state in which a light emitting element chip 40b is wire-bonded by use of a wire bonder WB; namely, a longitudinal cross sectional view of the light emitting device 10 (a cross sectional view of the light emitting device acquired when viewed in the direction of arrow X-X shown in FIG. 2)

FIG. 5A is a diagrammatic illustration showing a state in which the light emitting element chip 40b is wire-bonded by use of a wire bonder WB; namely, a longitudinal cross sectional view of the light emitting device 10 (a cross sectional view of the light emitting device acquired when viewed in the direction of arrow X-X shown in FIG. 2).

A substantially conical extremity of the wire bonder WB is inserted into the case 30 from the opening portion 31 in a direction of arrow α, and bonding wires (omitted from the drawings) are fixedly anchored to electrodes on an upper surface side of the light emitting element chip 40b.

Figure 5B:
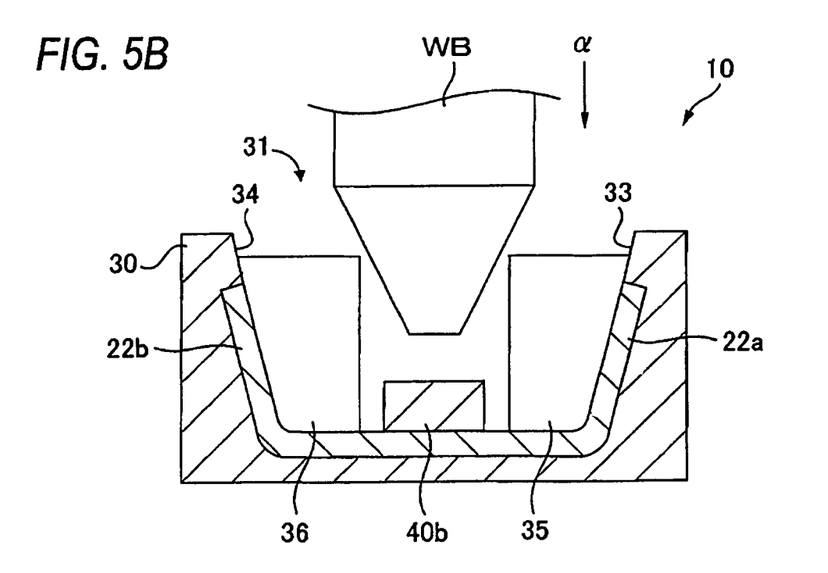
FIG. 5B is a diagrammatic illustration showing a state in which the columnar portions 35 and 36 of the case 30 are formed not into a tapered shape but into the shape of a substantially rectangular parallelepiped.

At this time, when the columnar portions 35 and 36 of the case 30 are formed not into a tapered shape but into the shape of a substantially rectangular parallelepiped as shown in FIG. 5B, the extremity of the wire bonder WB is caught by the columnar portions 35 and 36, to thus fail to reach the upper surface side of the light emitting element chip 40b. In addition to this problem, there also arises a problem of the reflector function of the columnar portions 35 and 36 being obstructed.

However, as shown in FIG. 5A, the columnar portions 35 and 36 of the case 30 are formed into a tapered shape in the present embodiment. Therefore, the problem occurring in the case shown in FIG. 5B can be solved.

[3] The angular portions (curvatures) 24 by means of which the respective bending portions 22a and 22b of the lead frames 20a and 20b are bent are rounded.

Therefore, the flow channels of the synthetic resin to the back side of the angular portions 24 of the respective lead frames 20a and 20b are sufficiently broadened and ensured.

For this reason, occurrence of an area not filled with a synthetic resin on the back side of the angular portions 24 can be prevented, so that the moldability of the case 30 can be enhanced.

[4] Both of the pointed angular portions 23 of the bending portions 22a and 22b in the respective lead frames 20a and 20b are rounded.

Therefore, the flow channels of the synthetic resin to both of the pointed angular portions 23 of the respective lead frames 20a and 20b are sufficiently broadened and ensured. Consequently, there can be prevented occurrence of an area not filled with a synthetic resin in the vicinity of both of the pointed angular portions 23, so that the moldability of the case 30 can be enhanced.

Both of the pointed angular portions 23 of the respective lead frames 20a and 20b can be prevented from coming off from the inner side surfaces 33 and 34 of the case 30.

Figure 6A:
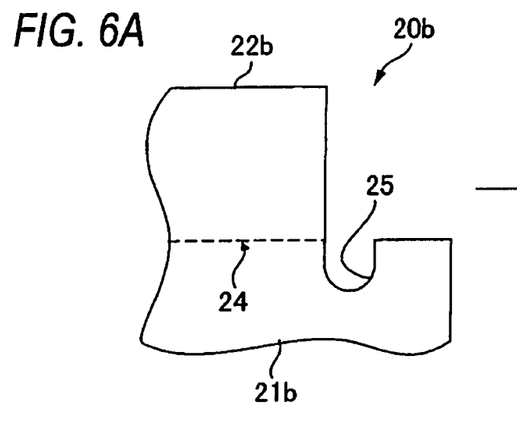
FIGS. 6A and 6C are plan views of a principal element showing a state achieved before a bend 22b of the lead frame 20b is bent.
Figure 6B:
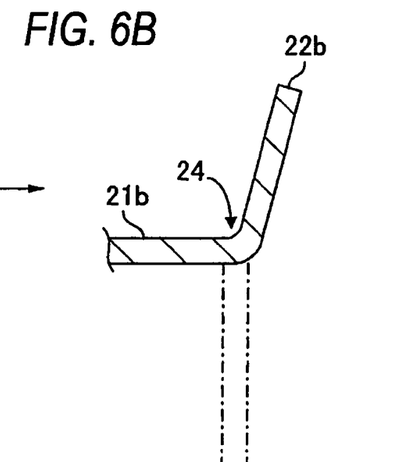
FIGS. 6B and 6D are longitudinal cross sectional views of a principal element showing a state achieved after the bend 22b is bent.
Figure 6C:
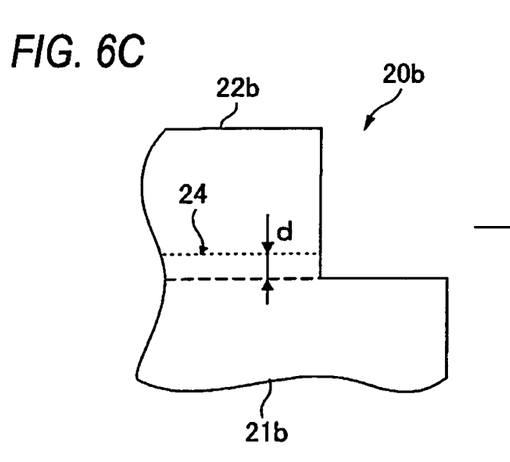
Figure 6D:
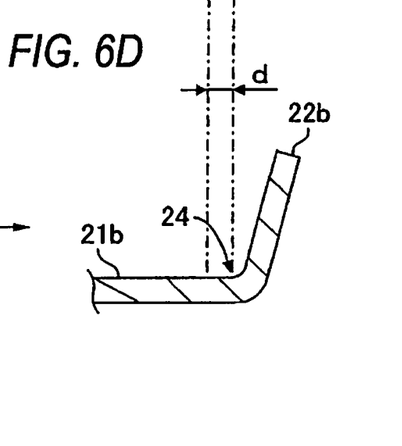

[5] FIGS. 6A and C are plan views of a principal element showing a state achieved before the bend 22b of the lead frame 20b is bent; and FIGS. 6B and 6D are longitudinal cross sectional views of a principal element showing a state achieved after the bend 22b is bent.

As shown in FIGS. 6C and D, when the notches 25 are not formed in the respective lead frames 20a and 20b, the bent angular portions (curvatures) 24 move toward the bending portions 22a and 22b by a width "d" when the bending portions 22a and 22b are formed.

Therefore, the accuracy achieved when the bending portions 22a and 22b are machined becomes lower, which raises a problem of the bending portions 22a and 22b becoming easy to come off from the case 30.

Further, the flow channels of a synthetic resin to the back side of the bent angular portions 24 becomes narrow, so that an area not filled with a synthetic resin becomes easy to arise on the back side of the angular portions 24, which raises a problem of deterioration of moldability of the case 30.

In contrast, in the present embodiment, the notches 25 are formed in the areas of the respective upper surfaces 21a and 21b of the respective lead frames 20a and 20b in proximity to the ends of the bending portions 22a and 22b, as shown in FIGS. 6A and 6B.

For this reason, stress that stems from bending action during formation of the bending portions 22a and 22b is released by means of the notches 25, and the thus-bent angular portions 24 can be situated on the upper surfaces 21a and 21b.

Therefore, the drawbacks that arise in the case shown in FIGS. 6C and D can be resolved by forming the notches 25 in the respective lead frames 20a and 20b.

In order to efficiently distribute and release the stress exerted on the notches 25, it is desirable to give a substantially-U-shaped profile to the notches 25.

[6] The columnar portions 35 and 36 of the case 30 cover the entirety of the lateral ends of the bending portions 22a and 22b of the respective lead frames 20a and 20b. Further, the columnar portions 35 and 36 are formed so as to become higher than the bending portions 22a and 22b. Still further, the columnar portions 35 and 36 are formed so as to become equal to or lower than the inner side surfaces 33 and 34 of the case 30. Therefore, the operation and the advantages described in connection with [1] can be enhanced to a much greater extent.

[7] The two light emitting element chips 40a and 40b are mounted on the different lead frames 20a and 20b, respectively.

For this reason, heat developed from the two light emitting element chips 40a and 40b travel through different heat radiation channels by way of the different lead frames 20a and 20b, to thus exit outside. Hence, even when a heavy electric current is caused to flow in order to illuminate the light emitting element chips 40a and 40b at high intensity, heat will not build up. Thus, a heat dissipation characteristic can be enhanced.

The columnar portions 35 and 36 of the case 30 are formed between the bending portions 22a and 22b of the adjacent lead frames 20a and 20b, thereby covering the lateral ends of the adjacent bending portions 22a and 22b.

Consequently, it becomes possible to efficiently arrange the columnar portions 35 and 36 in the case 30, and hence space in the case 30 can be efficiently utilized.

<Another Embodiment>

The present invention is not limited to the above embodiment and can also be embodied as follows. Even in such a case, the present invention can also exhibit and yield operation and advantages that are equal to or greater than those described in connection with the embodiment.

[1] The light emitting element chips 40a and 40b can also be electrically connected to the lead frames 20a and 20b by use of a flip-chip bonding technique.

[2] The light emitting element chips 40a and 40b can also be provided in number of three or more, and the columnar portions 35 and 36 of the case 30 can also be provided in number of two sets or more.

[3] The inner side surfaces 33 and 34 of the case 30 can also be formed in the shape of a curved plane.

[4] Connections between the front portions 37 and the lateral side portions 38 of the columnar portions 35 and 36 of the case 30 can also be chamfered, to thus be processed into the shape of a curved plane.

[5] Entire surfaces of the respective columnar portions 35 and 36 of the case 30 can also be formed into the shape of a curved plane.

The present invention is not at all limited to the descriptions about the respective aspects and embodiments mentioned above. The present invention shall encompass various modifications within the scope of the claims, so long as the modifications are easily conceivable for those skilled in the art. All specifics of theses, unexamined patent publication bulletins, Patent Gazettes, and the like, expressly provided in the present patent application shall be cited for reference.

The disclosure of Japanese Patent Application No. 2010-220466 filed Sep. 30, 2010 including specification, drawings and claims is incorporated herein by reference in its entirety.

What is claimed is:

1. A light emitting device, comprising:
   a case comprising an opened space therein, the space being defined by an inner bottom surface and an inner side surface of the case;
   a lead frame housed in the space, and comprising a bending portion bent along the inner side surface of the case; and
   a light emitting element electrically connected to the lead frame, wherein a rear surface of the bending portion is embedded in the case and a front surface of the bending portion is exposed from the inner side surface of the case so as to oppose the light emitting element,
   wherein a projecting portion projected from the inner bottom surface and inclined to contact the inner side surface of the case is formed between the bending portion and the light emitting element on the inner side surface of the case and
   wherein a width of an exposed surface of the projecting portion at a first intersection of the projecting portion with the inner bottom surface is more than a width of the exposed surface of the projecting portion at a second intersection of the projecting portion with the inner side surface of the case,
   wherein the first intersection is parallel with the second intersection, wherein the projecting portion covers a lateral side portion of the bending portion, and
   wherein the projecting portion is formed to become higher than the bending portion and become equal to or lower than the inner side surface of the case.

2. The light emitting device according to claim 1, wherein a corner portion of the lead frame, in which the bending portion is bent in the inner side surface, is rounded.

3. The light emitting device according to claim 1, wherein portions of the bending portion that are bent in the lead frame are rounded.

4. The light emitting device according to claim 1, wherein a notch is formed in an area of the lead frame in a proximity to an end of the bending portion.

5. The light emitting device according to claim 1, wherein the lead frame comprises one of a plurality of lead frames and the light emitting element comprises one of a plurality of light emitting elements, the light emitting elements are mounted on respective ones of the lead frames, and the projecting portion is formed between the bending portions of adjacent lead frames, so as to cover lateral ends of adjacent bending portions.

6. The light emitting device according to claim 1, wherein the projecting portion is monothethically formed with the case by a synthetic resin.

7. The light emitting device according to claim 1, wherein a lateral side of the bending portion is covered by the projecting portion.

8. The light emitting device according to claim 1, wherein the bending portion is bent along mutually-opposed inner side surfaces of the case.

9. The light emitting device according to claim 1, wherein the rear surface of the bending portion is disposed on the inner side surface of the case.

10. The light emitting device according to claim 1, wherein the projecting portion protrudes from the front surface of the bending portion toward the light emitting element.

11. The light emitting device according to claim 1, wherein the projecting portion covers a portion of the front surface of the bending portion that opposes the light emitting element.

12. The light emitting device according to claim 11, wherein the projecting portion is monolithically formed with the case to provide a mechanical strength to prevent the case from deforming during a thermal expansion.

13. A light emitting device, comprising:
   a case comprising an opened space therein, the space being defined by an inner bottom surface and an inner side surface of the case;
   a lead frame housed in the space, and comprising a bending portion bent along the inner side surface of the case; and
   a light emitting element electrically connected to the at least one lead frame; wherein a rear surface of the bending portion is embedded in the case and a front surface of the bending portion is exposed from the inner side surface of the case so as to oppose the light emitting element,
   wherein a projecting portion projected from the inner bottom surface and inclined to contact the inner side surface of the case is formed on the inner side surface of the case,
   wherein the projecting portion covers a lateral side of the bending portion and a portion of the front surface of the bending portion that opposes the light emitting element, wherein the projecting portion is formed to become higher than the bending portion and become equal to or lower than the inner side surface of the case, and wherein a width of an exposed surface of the projecting portion at a first intersection of the projecting portion with the inner bottom surface is more than a width of the exposed surface of the projecting portion at a second intersection of the projecting portion with the inner side surface of the case, wherein the first intersection is parallel with the second intersection.

14. The light emitting device according to claim 13, wherein the projecting portion is located between the bending portion and the light emitting element on the inner side surface of the case.

15. The light emitting device according to claim 13, wherein the projecting portion protrudes from the front surface of the bending portion toward the light emitting element.

16. The light emitting device according to claim 13, wherein the projecting portion is monolithically formed with the case to provide a mechanical strength to prevent the case from deforming during a thermal expansion.

17. A light emitting device, comprising:
a case comprising an opened space therein, the space being defined by an inner bottom surface and inner side surface of the case;
a lead frame housed the space, and comprising a bending portion bent along the inner side surface of the case; and
a light emitting element electrically connected to the lead frame, wherein a projecting portion projected from the inner bottom surface and inclined to contact the inner side surface of the case is formed on the inner side surface of the case, wherein the projecting portion is formed so to become higher than the bending portion and become equal to or lower than the inner side surface of the case, wherein a lateral side of the bending portion is covered by the projecting portion, and wherein a width of an exposed surface of the projecting portion at a first intersection of the projecting portion with the inner bottom surface is more than a width of the exposed surface of the projecting portion at a second intersection of the projecting portion with the inner side surface of the case, wherein the first intersection is parallel with the second intersection.

18. The light emitting device according to claim 1, wherein the width of the exposed surface of the projecting portion continuously decreases from the intersection of the projecting portion with the inner bottom surface toward the intersection of the projecting portion with the inner side surface of the case.

19. The light emitting device according to claim 1, wherein the exposed surface of the projecting portion includes a trapezoid that faces the light emitting element such that the intersection of the projecting portion with the inner bottom surface and the intersection of the projecting portion with the inner side surface of the case form opposing sides of the trapezoid.

* * * * *